United States Patent
Lee et al.

(10) Patent No.: US 7,012,335 B2
(45) Date of Patent: Mar. 14, 2006

(54) SEMICONDUCTOR DEVICE WIRING AND METHOD OF MANUFACTURING THE SAME

(75) Inventors: Jae-Hoon Lee, Kuri (KR); Kung-Hyon Nam, Seoul (KR)

(73) Assignee: Samsung Electronics Co., Ltd. (KR)

( * ) Notice: Subject to any disclaimer, the term of this patent is extended or adjusted under 35 U.S.C. 154(b) by 132 days.

(21) Appl. No.: 09/737,540

(22) Filed: Dec. 15, 2000

(65) Prior Publication Data

US 2002/0117686 A1 Aug. 29, 2002

(30) Foreign Application Priority Data

Feb. 22, 2000 (KR) .......................................... 2000-8558

(51) Int. Cl.
*H01L 23/48* (2006.01)

(52) U.S. Cl. .................. 257/758; 257/751; 257/752; 257/759; 257/774; 438/624; 438/626; 438/633; 438/639

(58) Field of Classification Search ................. 257/660, 257/774, 751–752, 758–759, 760; 438/692–693, 438/624, 626, 633, 637, 697, 700
See application file for complete search history.

(56) References Cited

U.S. PATENT DOCUMENTS

| | | | |
|---|---|---|---|
| 5,612,254 A | 3/1997 | Mu et al. | 437/195 |
| 5,663,797 A | 9/1997 | Sandhu | 438/16 |
| 5,710,460 A | 1/1998 | Leidy et al. | 257/752 |
| 5,840,503 A | 11/1998 | Beausang et al. | 435/0.21 |
| 5,877,076 A | 3/1999 | Dai | 438/597 |
| 5,915,175 A | 6/1999 | Wise | 438/238 |
| 5,973,400 A | 10/1999 | Murakami et al. | |
| 6,150,690 A * | 11/2000 | Ishibashi et al. | 257/306 |
| 6,184,143 B1 * | 2/2001 | Ohashi et al. | 438/697 |
| 6,265,780 B1 * | 7/2001 | Yew et al. | 257/759 |
| 6,541,863 B1 * | 4/2003 | Horstmann et al. | 257/753 |

FOREIGN PATENT DOCUMENTS

| | | |
|---|---|---|
| JP | 9129728 | 5/1997 |
| JP | 1098011 | 4/1998 |
| KR | 98-075153 | 11/1998 |

* cited by examiner

*Primary Examiner*—Donghee Kang
(74) *Attorney, Agent, or Firm*—Mills & Onello LLP

(57) ABSTRACT

A wiring of a semiconductor device and a method of manufacturing the same are disclosed. A first conductive layer is formed on a semiconductor substrate followed by a first insulation material which is deposited on the first conductive layer to form a first insulation layer. Then, a CMP process is implemented to form the first insulation layer. A second insulation layer is formed by depositing a second insulation material on the first insulation layer in order to cover a scratch formed on the first insulation layer after implementing the CMP process. A first etching pattern is formed by etching the second insulation layer to a thickness less than a thickness of the second insulation layer. Thereafter, a conductive material is deposited on the etching pattern and then a planarizing process is implemented to form a conductive pattern having a damascene shape. The formation of a bridge between neighboring conductive patterns caused by a scratch generated during implementation of CMP process can be prevented to markedly decrease defects in semiconductor devices.

14 Claims, 6 Drawing Sheets

SEMICONDUCTOR DEVICE WIRING AND METHOD OF MANUFACTURING THE SAME

BACKGROUND OF THE INVENTION

1. Field of the Invention

The present invention relates to a conductive wiring in a semiconductor device and a method of manufacturing the wiring, and more particularly to a wiring and method of manufacturing a wiring in a semiconductor device in which a bridge generation between neighboring conductive patterns caused by a scratch formed during a CMP process is prevented.

2. Description of the Related Art

In the manufacture of integrated circuits, planarization processes for various semiconductor materials are required to remove defects such as crystal defects, crookedness, scratches and roughness. Recently, there has been much progress in planarization processes along with the advancements of semiconductor devices, and chemical mechanical polishing (CMP) is widely utilized to improve a planarization degree among other planarization methods such as a reflowing method, an etch back method and the like. Particularly, since the planarization degree of an underlying layer affects the stability of a multi-layered wiring process, the CMP process attracts much attention as an advantageous approach for improving the quality and reliability of semiconductor devices.

The CMP process is commonly implemented for insulation layers. Then, an applying material on the insulation layer is deposited on a planarized layer. The planarized surface provides a constant depth of focus during photolithography exposure such that a surface provide,; a constant depth of focus during photolithography exposure such that a photoresist pattern wit a good profile can be produced.

The CMP process is implemented while fixing a thin and flat wafer. A layer such as an insulation layer or a metal layer is polished with pressure using a slurry having alumina or silica composition as a polishing agent. During the polishing process, it is difficult to prevent the generation of micro-scratches. The size, depth or number of the micro-scratches depends on the viscosity or state of the slurry. Some scratches might induce a fatal defect in semiconductor devices. The size of the scratches varies from several tens of angstroms to several thousand angstroms. Typically, scratches of several hundred to several thousand angstroms in size cannot be completely removed after the subsequent deposition of a conductive material. Such a scratch can cause formation of a bridge between conductive patterns.

At the region having a sub-micron design rule, the pitch of the conductive pattern is very small, and accordingly, insulating space between conductive patterns become small. Thus, a possibility of inducing a connection between neighboring conductive patterns and an undesirable short between them is increased when the scratch formed on the insulation space is filled with the conductive material.

When the CMP process is applied to the planarization of an insulation layer and wiring, a damascene process is commonly utilized for the formation of a metal pattern and a metal plug process is applied for filling a contact hole. The damascene process is implemented by forming an insulation layer, then depositing metal and planarizing by utilizing the CMP process. Conventionally, the metal pattern is formed by blanket depositing conductive material on an insulation layer such as a silicon oxide layer and then etching the obtained conductive material layer to form a desired metal pattern. However, by the damascene process, a groove for a desired metal pattern is formed on a underlying insulation layer and then metal is deposited to fill the groove.

Recently, a dual damascene method in which a contact hole is filled with a metal and where a metal pattern is simultaneously formed, is widely utilized. Each of U.S. Pat. Nos. 5,877,076 and 5,612,254 discloses such a dual damascene method in detail. When the metal plug and the metal pattern are simultaneously formed by the above-described method, the characteristics of the thus obtained device are improved because a uniform pattern can be obtained to an edge portion. However, a large number of processing steps are needed and the manufacturing method becomes complicated.

Accordingly, the contact hole and the metal pattern are simultaneously formed by a more simplified method. FIGS. 1A to 1D are schematic cross-sectional views which illustrate a method for manufacturing a wiring of a semiconductor device according to the conventional method.

Referring to FIG. 1A, on a semiconductor substrate 100 divided into an active region and a field region by a field oxide layer (not shown), a gate electrode 120 is formed on the active region by a conventional method. The gate electrode 120 is formed of a first conductive layer 124 constituted by a material such as conductive polysilicon doped with an impurity and a second conductive layer 126 formed from a material such as tungsten silicide or tantalum silicide. Source/drain regions 110a and 110b are formed on the active region of the semiconductor substrate 100 exposed by the gate electrode 120 by doping impurity. On the gate electrode 120, an insulating material such as BPSG (borophosphosilicate glass) is deposited by a chemical vapor deposition method to a thickness of about 3000–10000 Å in order to insulate the gate electrode 120 and a subsequently formed conductive layer.

Thereafter, CMP process is implemented to planarize the deposited insulation material, the surface of which is rough and crooked, to obtain a planarized insulation layer 130. After implementing the CMP process, a scratch 135 having a depth of 2000 Å is formed on insulation layer 130 as illustrated in FIG. 1A.

Referring to FIG. 1B, two etching processes on the insulation layer 130 are continuously carried out by utilizing photoresist patterns as etching masks to form a contact hole 140 for an electrical connection with the source or drain region 110a or 110b of a transistor with a conductive layer and to form an etching pattern 150 for the formation of a metal pattern. At this time, an upper portion of the insulation layer 130 for separating a neighboring etching pattern 150 and the contact hole 140 does not remain by the scratch 135 as shown by FIG. 1A. That is, the upper portions of the etching pattern 150 and the contact hole 140 are partially connected to form a bridge and the generation of this bridge increases as the size of a device decreases.

Referring to FIG. 1C, a barrier metal layer 155 is formed by depositing Ti/TiN on the insulation layer 130 on which the etching pattern is formed. Then, metal material such as tungsten, copper, aluminum and the like is deposited on the barrier metal layer 155 to fill the etched portion and to form a metal layer 160.

Referring to FIG. 1D, a plug 170 of the contact hole and a metal wiring 180 of the damascene shape are formed by implementing the CMP process and removing the upper portion of the insulation layer 130. At this time, the scratch formed on the insulation layer 130 is filled with metal to give a scratch pattern 175 for connecting a neighboring plug 170 of the contact hole and the metal wiring 180. This defect induces undesirable short between neighboring conductive patterns. Particularly, since the metal pattern and the plug of the contact hole are formed on the same layer, it is difficult to differentiate the plug of the contact hole from a metal pattern, and interval between metal patterns become narrower.

Thus, the formation of a bridge between the metal patterns by the scratch generated during the CMP process increases.

In order to solve this problem, various methods have been suggested. U.S. Pat. No. 5,915,175 (issued to Wise) discloses a method for solving the problem caused by the scratch. In this patent, a reflowable material such as BPSG is utilized as an insulation layer. After implementing the CMP process, the insulation layer including a scratch is reflowed and then the same insulating material is deposited to form a second insulation layer.

However, by this method, a high temperature process is required for the reflow. For example, BPSG insulation layer should be treated at about 750–1100° C. under a $N_2$, $O_2$ or $H_2O$ atmosphere. This complicates the manufacturing process and lowers the productivity of the device.

U.S. Pat. Nos. 5,710,460 and 5,840,503 (both issued to Leidy et al.) disclose devices having three-layered insulation layers. On an insulation layer that includes a scratch, a curable polymer such as SOG (spin-on glass) is deposited to fill the scratch. Then, heat is applied to cure the polymer and remove solvent to manufacture a polymer film. On the polymer film, an insulating material is deposited again.

However, by this method, a first heat treatment is implemented at about 100–150° C. for about 3–10 minutes and then a second heat treatment is implemented at about 350–850° C. for about 30 minutes under an inert gas atmosphere such as $N_2$ for curing the polymer. Thus, for this method, the process is also too complicated and the productivity of the device is very low.

SUMMARY OF THE INVENTION

Accordingly, it is an object in the present invention to provide a wiring of a semiconductor device having minimized shorts between circuits and an improved quality by reducing formation of bridges between neighboring conductive patterns caused by a scratch.

Another object of the present invention is to provide an economic and advantageous method of manufacturing the wiring of the semiconductor device in which no additional heat treatment is required.

To accomplish the object, there is provided in the present invention a wiring of a semiconductor device which comprises a first conductive layer formed on a semiconductor substrate and a first insulation layer formed on the first conductive layer, the first insulation layer having been planarized by a CMP process and including a scratch on a surface thereof. The device further comprises a second insulation layer formed on the first insulation layer. A second conductive layer contacting the first conductive layer through the first and second insulation layers and a third conductive layer formed by a damascene method on an upper portion of the second insulation layer also are included in the device. The third conductive layer is thinner than the second insulation layer.

In one embodiment, the second conductive layer includes a plug filling a via hole connecting with the first conductive layer. The plug filling a contact hole can also connect with an impurity doped region on the semiconductor substrate. In addition, the first and second insulation layers can be formed from the same insulation material. Also, the first conductive layer can be an impurity doped region on the semiconductor substrate.

In one embodiment, the device also includes a third insulation layer and a fourth conductive layer contacting the third conductive layer through a window formed on the third insulation layer. The third insulation layer and the fourth conductive layer are formed on the second and third conductive layers. The fourth conductive layer can be a bit line formed from a conductive material selected from a group consisting of tungsten, aluminum and copper.

The object of the present invention may be accomplished by a wiring of a semiconductor device including a first conductive layer formed on a semiconductor substrate, a first insulation layer formed on the first conductive layer, planarized by a CMP process and including a scratch on a surface thereof and a second insulation layer formed on the first insulation layer. A second conductive layer is formed by a damascene method on an upper portion of the second insulation layer and is thinner than the second insulation layer.

Another object of the present invention is accomplished by a method of manufacturing a wiring of a semiconductor device. A first conductive layer is formed on a semiconductor substrate, and a first insulation layer is formed on the conductive layer by depositing a first insulating material and implementing CMP process. A second insulation layer is formed by depositing a second insulation material on the first insulation layer in order to cover a scratch formed on the first insulation layer after implementing the CMP process. An etching pattern is formed by etching the second insulation layer to a thickness less than a thickness of the second insulation layer. A conductive pattern of a second conductive layer having a damascene shape is formed by depositing a conductive material on the etching pattern and then planarizing the second conductive layer thus obtained.

In the present invention, an insulation layer is formed by two steps in order to prevent a short caused by a scratch generated by the CMP process. The thickness of the second insulation layer is thicker than the depth of an etching pattern formed by a subsequent etching process.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS OF THE INVENTION

Figure 1A:
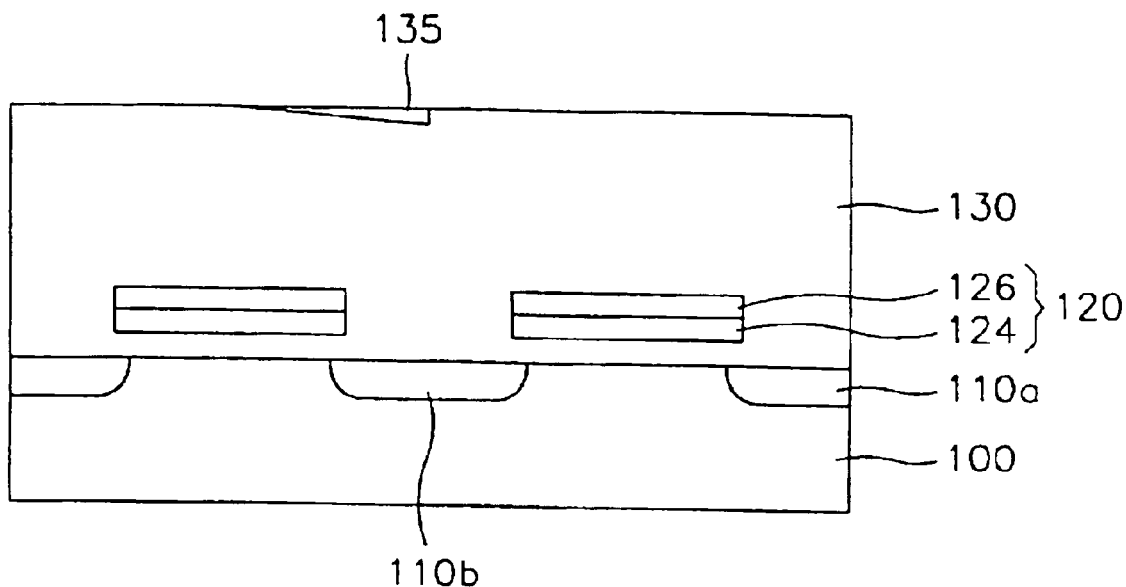
FIGS. 1A to 1D are schematic cross-sectional views which illustrate a method for manufacturing a wiring of a semiconductor device according to a conventional method.
Figure 1B:
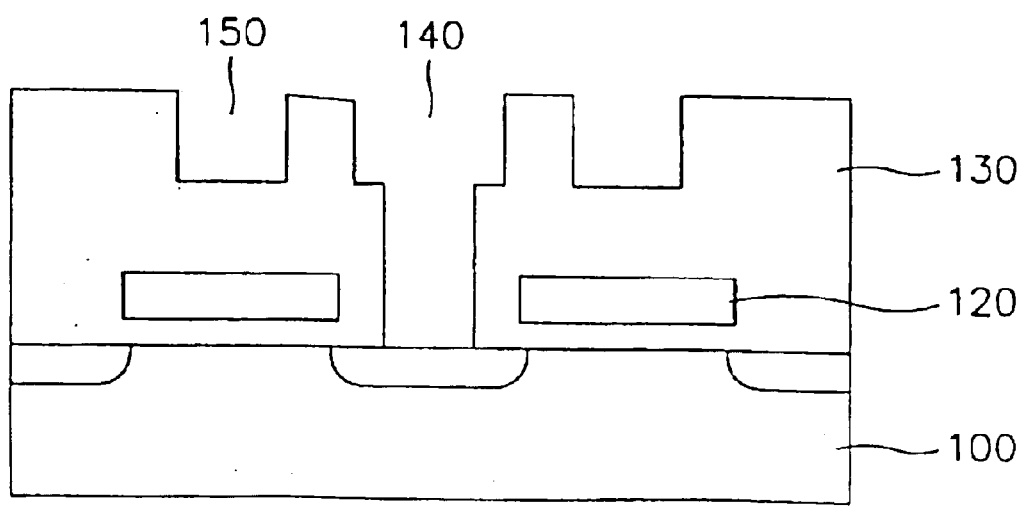
Figure 1C:
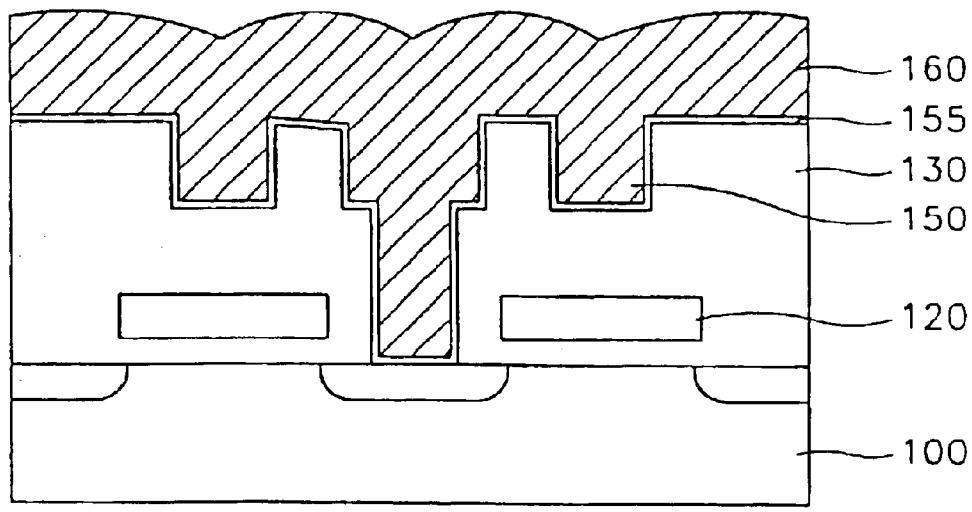
Figure 1D:
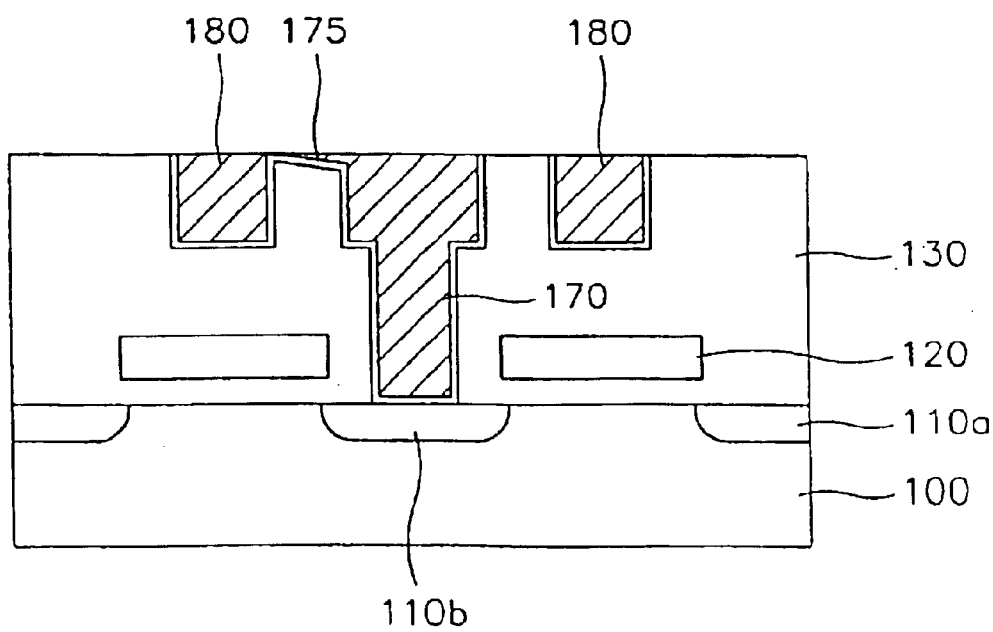
Figure 2:
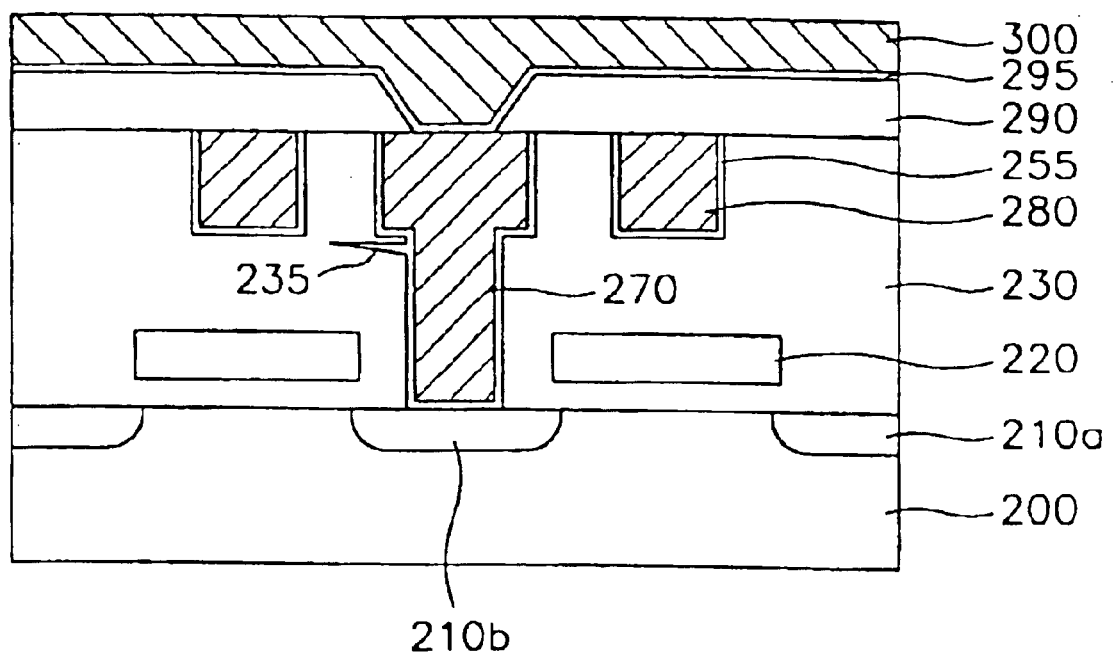
FIG. 2 is a schematic cross-sectional view of a wiring of a semiconductor device according to an embodiment of the present invention.

FIG. 2 is schematic cross-sectional view of a wiring of a semiconductor device according to an embodiment of the present invention.

Impurity doped regions 210a and 210b are formed on a semiconductor substrate 200, and a gate electrode 220 is formed between impurity doped regions 210a and 210b. On the semiconductor substrate 200 and the gate electrode 220, an insulation layer 230 is formed for an insulation with an upper conductive layer. On the insulation layer 230, a first metal layer 270 filling a contact hole exposing the impurity doped regions 210a and 210b and a second metal layer 280 having a damascene shape from an upper surface of insulation layer 230 to a predetermined depth are formed.

For this device, a scratch 235 generated by CMP process is present in insulation layer 230 which is formed of first and a second insulation layers and lies at a position which is lower than the second metal layer 280. The scratch 235 is connected with the first metal layer 270, however, it is not connected to second metal layer 280 formed under the scratch 235. Thus, the formation of a bridge which would have been caused by the scratch 235 after implementing the CMP process between the first and second metal layers 270 and 280 is prevented. Between the first and second metal layers 270 and 280 and the insulation layer 230, a first barrier metal layer 255 is formed. The barrier metal layer 255 is formed by a double layer of Ti/TiN layers.

On the planarized metal pattern layer, a third insulation layer 290 for insulating the first and second metal layers 270 and 280 with a conductive layer, which will be formed on third insulation layer 290, is formed. On the third insulation layer 290, a second barrier metal layer 295 formed of Ti/TiN and a third metal layer 300, which are connected with the first metal layer 270 through a window, are formed.

FIGS. 3A to 3F are schematic cross-sectional views which illustrate an embodiment of the method for manufacturing a wiring of a semiconductor device according to the present invention. The manufacturing method of a wiring of a semiconductor device illustrated in FIG. 2 will be explained in detail with reference to FIGS. 3A to 3F herein below.

Figure 3A:
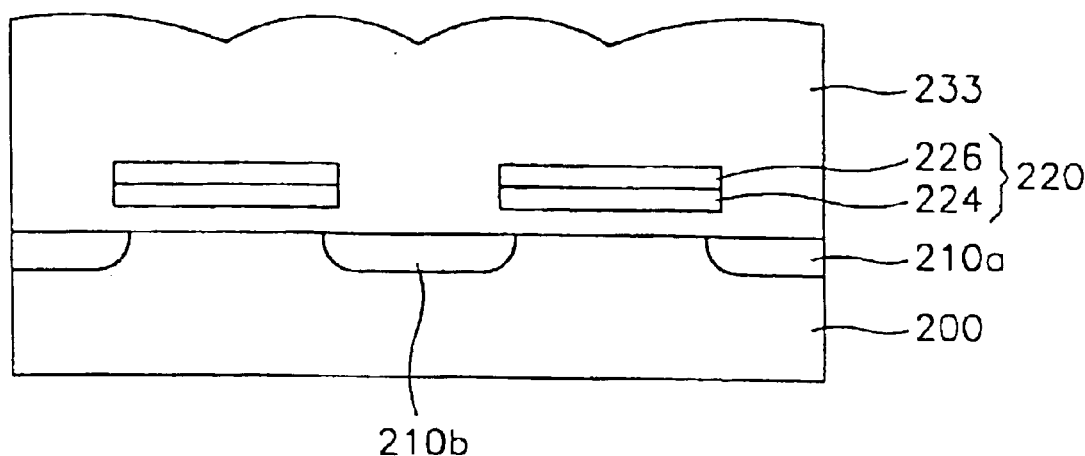
FIGS. 3A to 3F are schematic cross-sectional views which illustrate an embodiment of the method for manufacturing a wiring of a semiconductor device according to the present invention.

Referring to FIG. 3A, on an N-type or P-type semiconductor substrate 200 divided into an active region and a field region by a field oxide layer having about 1800–2200 Å thickness, a gate electrode 220 is formed by a conventional method. For example, conductive polysilicon doped with an impurity is deposited to form a first conductive layer 224 with a thickness of about 1000 Å and then tungsten silicide or tantalum silicide is deposited by a chemical vapor deposition method to form a second conductive layer 226 with a thickness of about 1500 Å. On the second conductive layer 226, silicon oxide is deposited by au low pressure chemical vapor deposition method to form an oxide insulation layer with a thickness of about 1000 Å, and a photoresist pattern is formed. The oxide layer, second conductive layer 226 and first conductive layer 224 are anisotropically etched utilizing the photoresist pattern as an etching mask until the semiconductor substrate 200 is exposed to form the gate electrode 220.

Into the exposed active region of the substrate, $N^+$ or $P^+$ impurity is doped to form source/drain regions 210a and 210b to manufacture an NMOS transistor or PMOS transistor.

For insulating the conductive gate electrode 220 with a conductive layer which will be formed afterward, silicon oxide such as BPSG (borophosphosilicate glass), PSG (phosphosilicate glass), PEOX (plasma enhanced oxide), P-TEOS (poly tetraethyl orthosilicate), USG (undoped silicate glass), HTO (high temperature oxide), and the like is deposited by a chemical vapor deposition, a low pressure chemical vapor deposition, or by a plasma enhanced chemical vapor deposition method to form an insulation layer 233.

Figure 3B:
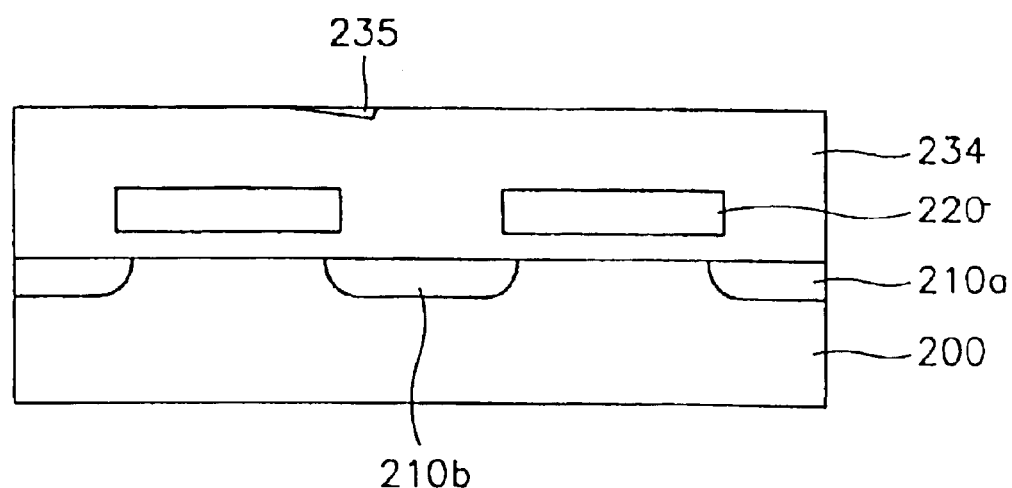

Referring to FIG. 3B, CMP process is implemented to form a planarized first insulation layer 234 which has a desired thickness. As a polishing solution, an alkaline solution of which pH is about 11 and including about 10% by weight of colloidal silica of which size is about 3 μm and about 5% by weight of ammonium hydroxide based on the total amount of the solution, is preferably utilized. As a polishing pad, a polyurethane pad including foamed plastic microballons is preferably utilized. An appropriate polishing pressure is about 14 psi and an appropriate removing velocity of the insulation layer is about 1200 Å/min.

At this time, the thickness of the first insulation layer is controlled to obtain a sufficient insulation of lower and upper conductive layers. After implementing the CMP process, a scratch having at most 2000 Å size may be formed on the upper portion of first insulation layer 234.

Figure 3C:
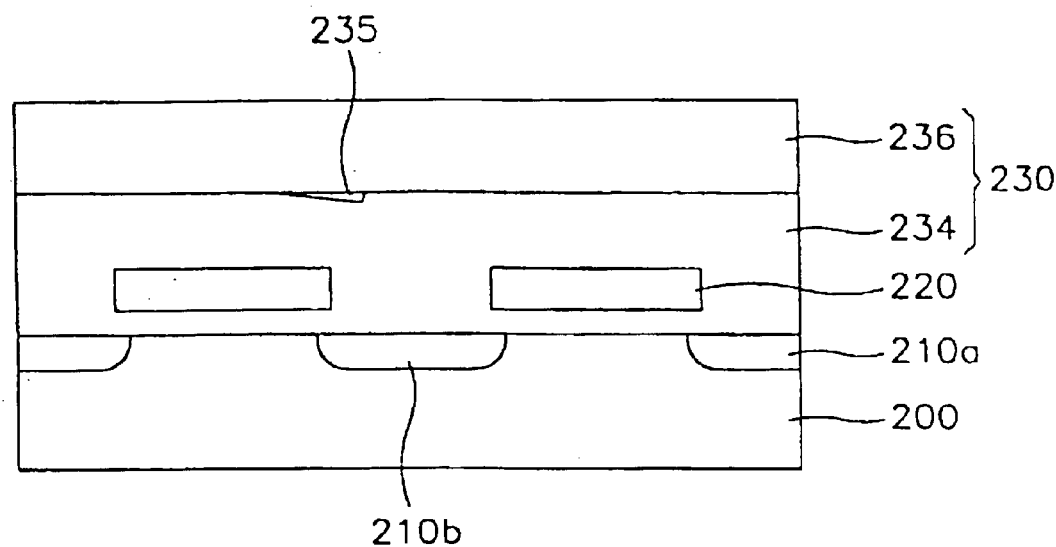

Referring to FIG. 3C, an insulation material is deposited on the first insulation layer 234 to form a second insulation layer 236 in order to sufficiently cover the scratch 235. The second insulation layer 236 is thicker than a wiring layer to be formed in a damascene shape afterward. The first and second insulation layers 234 and 236 can be formed from different insulation materials but preferably from a same material. More preferably, an oxide material is utilized. The total thickness of the first and second insulation layers 234 and 236 is about 5000–10000 Å, and preferred thickness is about 8000 Å.

Figure 3D:
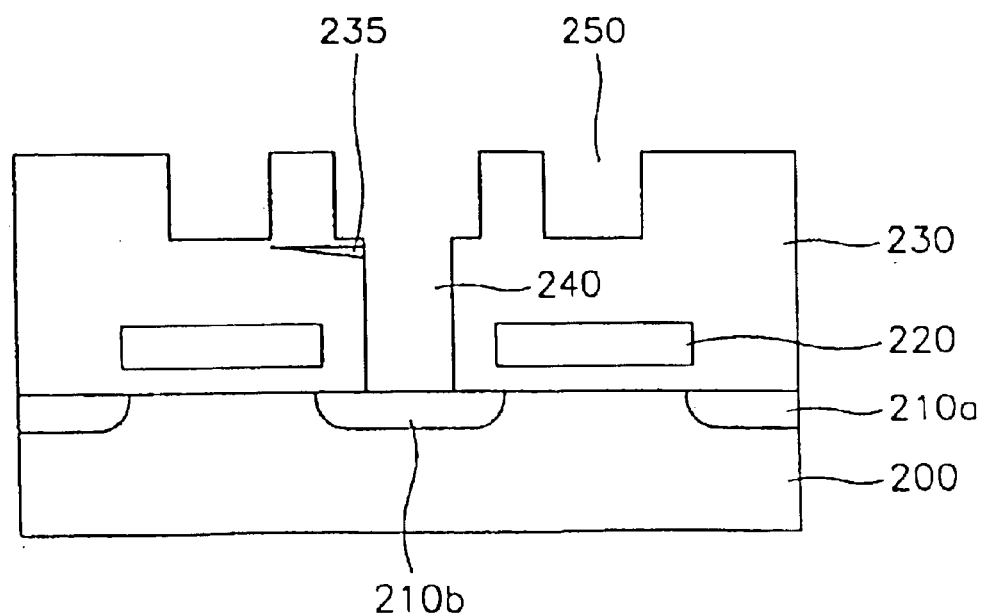

Referring to FIG. 3D, an insulation layer 230 including the first and second insulation layers 234 and 236 is anisotropically etched utilizing a photoresist pattern as an etching mask to form a first etching pattern 240 by which underlying conductive layer is exposed. The first etching pattern 240 may be a pattern for forming a contact hole which exposes a portion of source/drain region 210a and 210b to form an interconnection of the source/drain regions 210a and 210b of a transistor with an upper conductive layer. Alternatively, the first etching pattern 240 can be a pattern for forming a via hole to form an interconnection of an underlying conductive layer with an upper conductive layer.

The second insulation layer 236 is etched to a predetermined thickness utilizing a photoresist pattern as an etching mask to form a second etching pattern 250 for the formation of a metal pattern. The depth of the second etching pattern 250 should be thinner than the thickness of the second insulation layer 236 so that the scratch 235 formed on the surface of the first insulation layer 234 is not exposed. The etching depth of the second insulation layer 236 is controlled by setting RF power, etching time and etching thickness and considering the material to be etched. The sequence of the formation of the first and second etching patterns 240 and 250 is not critical.

In this structure of the invention, the first etching pattern 240 and the scratch 235 can be connected, however, the second etching pattern 250 and the scratch 235 cannot be connected because the second etching pattern 250 and the first insulation layer 234 are formed apart from some distance. Accordingly, the first and second etching patterns 240 and 250 are not connected through the scratch 235.

Figure 3E:
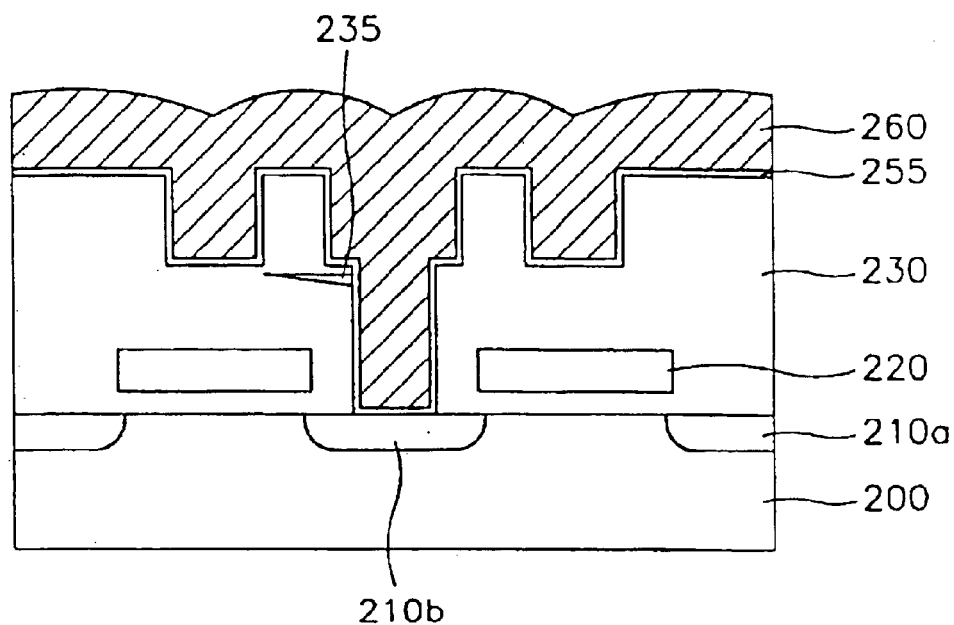

Referring to FIG. 3E, a diffusion barrier layer 255 is formed on the insulation layer on which etching patterns are formed so as to prevent diffusion of materials from upper or underlying layers to underlying or upper layers. The diffusion barrier layer 255 is formed from metal having a good adhesiveness to a metal layer and having a similar thermal expansion coefficient with that of the metal layer. For example, titanium, tungsten, titanium nitride, titanium-tungsten alloy, and the like can be used. The thickness of the diffusion barrier layer 255 is about 500–15000 Å.

On the diffusion barrier layer 255, metal such as tungsten, copper, aluminum, aluminum-copper alloy, aluminum-copper-tungsten alloy, aluminum-scandium alloy, gold, silver or molybdenum is deposited by a chemical vapor deposition method or other sputtering method to form a metal layer 260. One preferred metal is tungsten which has a low resistivity, a high melting point and a good chemical vapor deposition characteristic to give a good step coverage. Particularly, tungsten has a good step coverage in processing filling of a contact hole by the chemical vapor deposition method. As a source of tungsten, tungsten hexafluoride ($WF_6$) of which boiling point is at the room temperature is better than tungsten hexachloride ($WCl_6$) which is a solid state at the room temperature. Further, since the metal is simultaneously utilized to form a plug which fills the contact hole as well as a metal pattern in the present invention, tungsten is a recommended metal.

The thickness of the metal layer 260 is not limited but a preferred value is above 6000 Å. However, considering the time consumption of the subsequent planarization process, an excessively thick metal layer is not preferred.

Figure 3F:
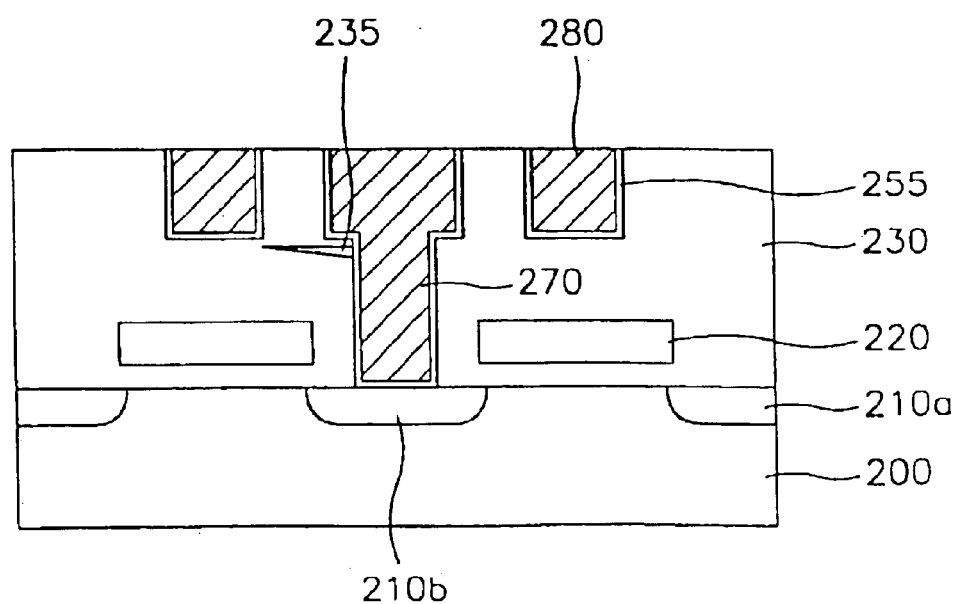

Referring to FIG. 3F, a CMP process is implemented to remove excessive metal and to planarize the metal layer until the upper portion of the insulation layer 230 is exposed. Then, a metal plug 270 for filling the contact hole and a metal pattern 280, for example, for a word line, are formed.

A scratch may be formed during the CMP process, however, metal material cannot be filled into the already formed metal pattern. Accordingly, a bridge between neighboring patterns previously caused by the scratch is prevented.

The end point of the CMP process of polishing the metal layer should be correctly controlled. Generally, metal material is deposited on an insulation layer and fills a hole or a trench formed on the insulation layer. In order to electrically insulate metal patterns, the CMP process should be ended at the uppermost portion of the insulation layer and at the lowermost portion of the metal layer which does not fill the hole and the trench. If the CMP process is completed before an appropriate endpoint, under-polishing results, and metal patterns are not electrically separated, thus causing a short. If the CMP process is completed after the appropriate endpoint, it results in over-polishing and a metal pattern having a desirable thickness cannot be obtained. Accordingly, the polishing should be controlled to an appropriate thickness by utilizing a method such as measuring a surface reflectivity utilizing a laser beam, a method disclosed in U.S. Pat. No. 5,663,797 (issued to Sandhu) or the Like.

As a polishing solution, an alkaline solution of which pH is about 9–13 and includes colloidal silica having a particle size of about 0.3 $\mu$m and ammonium hydroxide is preferably utilized. As a polishing pad, a polyurethane pad including foamed plastic microballons is preferably utilized.

After completing the CMP process, a conductive layer is formed on the metal pattern. More particularly, an insulation material such as silicon oxide is deposited to about 6000 Å thickness to form a third insulation layer 290 for an insulation from underlying conductive layer. Then, a photoresist pattern including a window for exposing a portion to be etched, is formed utilizing photolithography. The portion of the third insulation layer 290 exposed by the photoresist pattern is etched by a reactive ion etching method to expose a tungsten plug portion 270. A second diffusion barrier layer 295 formed of Ti/TiN is formed to a thickness of about 1200 Å and tungsten is deposited to a thickness of about 6000 Å to form a metal pattern 300 such as a bit line. A metal wiring of a semiconductor device illustrated in FIG. 2 can be obtained.

According to the method for manufacturing a metal wiring of a semiconductor device of the present invention, the formation of a bridge caused by a scratch generated during CMP process of an insulation layer can be solved without a separate heat treatment or additional processes.

In describing the preferred embodiment of the present invention, a semiconductor device including a polysilicon gate, a word line, a source region, a drain region, a contact hole, a bit line and the like was illustrated. However, the present invention is not limited to this device and can be applied to another embodiment within the scope of the spirit of the present invention.

For example, the above embodiment of the present invention is directed to a method for solving the problem generated by a scratch formed between neighboring plug for filling a contact hole and a metal pattern. However, the present invention can be applied between same metal patterns or conductive patterns. That is, in a device including an underlying conductive layer, an insulation layer planarized by a CMP process and an upper conductive layer formed by a damascene method, a generation of a bridge between wirings due to a scratch can be prevented by forming the insulation layer in two steps. First, a first insulation layer planarized by the CMP process and including a scratch on the surface thereof is formed on the underlying conductive layer. Then, a second insulation layer is formed by a plasma enhanced chemical vapor deposition method, etc.

At this time, the thickness of the second insulation layer should be thicker than a depth of an etching pattern subsequently. The etching pattern is formed by utilizing photolithography. On the etching pattern, a conductive material is deposited and the CMP process is implemented to manufacture a conductive pattern in a damascene manner. Since the wiring thus formed includes a scratch under the wiring, any defect from the scratch can be prevented.

In addition, the method for manufacturing wiring according to the present invention can be applied to almost all of the semiconductor devices including NMOS, PMOS, CMOS, BiCMOS, bipolar devices, and the like.

According to the present invention, a bridge generation between neighboring conductive patterns due to a scratch formed during a CMP process can be prevented, thus an occurrence of short caused by the bridge can be markedly reduced. In addition, an insulation layer including two separate insulation layers cannot be formed by a same insulation material as well as by different materials. As a result, a deterioration of characteristics caused by an interface between different insulation materials can be prevented.

Further, since a separate high temperature process is not required in the present invention, the manufacture of the wiring is advantageous and a bridge between minute and conductive neighboring patterns due to a scratch formed on the surface of an insulation layer during CMP process can be prevented.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A wiring of a semiconductor device comprising:

a first conductive layer formed on a semiconductor substrate;

a first insulation layer formed on said first conductive layer, wherein the first insulation layer has a scratch on a surface thereof after the surface is planarized by a CMP process;

a second insulation layer formed on said first insulation layer to cover the scratch formed on the surface of the first insulation layer;

a second conductive layer contacting said first conductive layer through a via hole formed in said first and second insulation layers, a groove formed in said second insulation layer over the via hole in contact with the via hole, and having a width wider than a width of the via hole, the groove having a depth less than the thickness of said second insulation layer; and a third conductive layer formed in the groove formed in said second insulation layer, the third conductive layer having a thickness less than the thickness of said second insulation layer.

2. A wiring of a semiconductor device as claimed in claim 1, wherein said first and second insulation layers are formed from a same insulation material.

3. A wiring of a semiconductor device as claimed in claim 1, wherein said second conductive layer comprises a plug filling said via hole.

4. A wiring of a semiconductor device as claimed in claim 1, wherein said first conductive layer is an impurity doped region on said semiconductor substrate.

5. A wiring of a semiconductor device as claimed in claim 1, further comprising:

a third insulation layer formed on said second insulation layer, having a second via hole therein; and a fourth conductive layer formed on said third insulation layer, contacting said third conductive layer through said second via hole.

6. A wiring of a semiconductor device as claimed in claim 5, wherein said fourth conductive layer is a bit line formed from a conductive material selected from a group consisting of tungsten, aluminum and copper.

7. A wiring of a semiconductor device as claimed in claim 1, wherein said second conductive layer is formed from a metal selected from a group consisting of tungsten, aluminum and copper.

8. A wiring of a semiconductor device comprising:

a first conductive layer formed on a semiconductor substrate;

a first insulation layer formed on said first conductive layer;

a second insulation layer formed immediately over said first insulation layer and contacting said first insulation layer, said first and second insulation layers being formed of a same material;

a second conductive layer contacting said first conductive layer through a via hole formed in said first and second insulation layers, the groove formed in said second insulation layer over the via hole in contact with the via hole, and having a width wider than a width of the via hole, the groove having a depth less than the thickness of said second insulation layer; and a third conductive layer formed in the groove formed in said second insulation layer, the third conductive layer having a thickness less than the thickness of said second insulation layer.

9. A wiring of a semiconductor device as claimed in claim 8, wherein said second conductive layer comprises a plug filling said via hole.

10. A wiring of a semiconductor device as claimed in claim 8, wherein said first conductive layer is an impurity doped region on said semiconductor substrate.

11. A wiring of a semiconductor device as claimed in claim 8, further comprising:

a third insulation layer formed on said second insulation layer, having a second via hole therein; and a fourth conductive layer formed on said third insulation layer, contacting said third conductive layer through said second via hole.

12. A wiring of a semiconductor device as claimed in claim 11, wherein said fourth conductive layer is a bit line formed from a conductive material selected from a group consisting of tungsten, aluminum and copper.

13. A wiring of a semiconductor device as claimed in claim 8, wherein said second conductive layer is formed from a metal selected from a group consisting of tungsten, aluminum and copper.

14. A wiring of a semiconductor device as claimed in claim 8, wherein a top surface of the first insulation layer is a chemically mechanically polished (CMP) surface.

* * * * *

UNITED STATES PATENT AND TRADEMARK OFFICE
CERTIFICATE OF CORRECTION

| | | |
|---|---|---|
| PATENT NO. | : 7,012,335 B2 | Page 1 of 1 |
| APPLICATION NO. | : 09/737540 | |
| DATED | : March 14, 2006 | |
| INVENTOR(S) | : Jae-Hoon Lee et al. | |

It is certified that error appears in the above-identified patent and that said Letters Patent is hereby corrected as shown below:

In Column 9, Claim 1, Line 15, delete "," and insert -- ; -- after "layers".
In Column 9, Claim 1, Line 15, insert a new paragraph at "a groove…".
In Column 10, Claim 8, Line 13, delete "," and insert -- ; -- after "layers".
In Column 10, Claim 8, Line 14, delete "the" and insert -- a -- before "groove".

Signed and Sealed this

Thirty-first Day of October, 2006

JON W. DUDAS
*Director of the United States Patent and Trademark Office*